United States Patent
Lindt

(10) Patent No.: US 7,275,173 B2
(45) Date of Patent: Sep. 25, 2007

(54) METHOD FOR MEASURING AND COMPENSATING FOR SKEWS OF DATA TRANSMISSION LINES BY COMPENSATING FOR SKEW BY DELAY ELEMENTS SWITCHED IN RESPONSE TO THE CALCULATED REATIVE SKEW

(75) Inventor: Paul Georg Lindt, Donauworth (DE)

(73) Assignee: Infineon Technologies AG, Munich (DE)

( * ) Notice: Subject to any disclaimer, the term of this patent is extended or adjusted under 35 U.S.C. 154(b) by 371 days.

(21) Appl. No.: 10/808,145

(22) Filed: Mar. 24, 2004

(65) Prior Publication Data

US 2005/0005184 A1    Jan. 6, 2005

Related U.S. Application Data

(60) Provisional application No. 60/457,810, filed on Mar. 26, 2003.

(51) Int. Cl.
*G06F 1/00* (2006.01)
(52) U.S. Cl. .................................. 713/500
(58) Field of Classification Search ............. 713/500; 714/700, 814; 370/508, 509
See application file for complete search history.

(56) References Cited

U.S. PATENT DOCUMENTS 6,031,847 A * 2/2000 Collins et al. ............. 370/508
6,820,234 B2 * 11/2004 Deas et al. ................. 714/814
6,907,552 B2 * 6/2005 Collins ....................... 714/700
2003/0046618 A1 * 3/2003 Collins ....................... 714/700
2003/0112827 A1 * 6/2003 Cox et al. .................. 370/509

* cited by examiner

*Primary Examiner*—Thomas Lee
*Assistant Examiner*—Sean Weinman
(74) *Attorney, Agent, or Firm*—Jenkins, Wilson, Taylor & Hunt, P.A.

(57) ABSTRACT

Method for measuring and compensating skews of data transmission lines connecting at least one data transmission device with a data reception device via a parallel data bus comprising for each data transmission line the following steps: measuring the relative time delay of the data transmission line by transmitting a determined sequence of measurement vectors (MV) each consisting of an alternating bit pattern via said data transmission line, wherein the bit alternation frequency is halfed with every transmitted measurement vector (MV); comparing the received measurement vectors (MV') transmitted via said data transmission line with corresponding reference vectors (RV) stored in said data reception device; shifting the received measurement vectors by inserting data unit intervals (UI) until a received measurement vector (MV') matches a corresponding reference vector (RV); calculating a relative skew of the data transmission line depending of the number of inserted data unit intervals (UI) with respect to a slowest data transmission line; and compensating the calculated relative skew of the data transmission line by means of delay elements switched in response to the calculated relative skew.

13 Claims, 11 Drawing Sheets

Danger to data integrity resulting from delay time differences

+3UI i=0  RV 1 0 1 0 1 0 1 0 1 0 1 0 1 0
     MV 0 0 0 1 0 1 0 1 0 1 0 1 0 1 0 1 cmp result 1 0 1 1 :1 1 1 1 1 1 1 1 1 1: static "1" identifies negative match
           → $2^0$ UI skew identified.
             Insert = 1

FIG. 9a i=1  RV 1 1 0 0 1 1 0 0 1 1 0 0 1 1 0 0
     MV 0 0 0 0 1 1 0 0 1 1 0 0 1 1 0 1 cmp result 1 1 0 0 :0 0 0 0 0 0 0 0 0 0: static "0" identifies positive match
           → exit condition from loop

FIG. 9b i=2  RV 1 1 1 1 0 0 0 0 1 1 1 1 0 0 0 1 1
     MV 0 0 0 0 1 1 1 1 0 0 0 0 1 1 cmp result 1 1 1 1 :1 1 1 1 1 1 1 1 1 1: static "1" identifies negative match
           → positive skew identified, i.e.
             skew = $2^2$ − insert = +3UI

FIG. 9c

−3UI i=0  RV        1 0 1 0 1 0 1 0 1 0 1 0 1 0 1 0
     MV 1 0 1 0 1 0 1 0 1 0 1 0 1 0 1 0 1 0 1
     cmp result  1 1 1 1 1 1 1 1 1 1 1 1 1 1 1 1  static "1" identifies negative match
                                        → $2^0$ UI skew identified.
                                          Insert = 1

FIG. 10a i=1  RV        1 1 0 0 1 1 0 0 1 1 0 0 1 1 0 0
     MV 0 1 1 0 0 1 1 0 0 1 1 0 0 1 1 0 0 1
     cmp result  1 1 1 1 1 1 1 1 1 1 1 1 1 1 1 1  static "1" identifies negative match
                                        → $2^1$ UI skew identified.
                                          Insert = 3

FIG. 10b i=2  RV        1 1 1 1 0 0 0 0 1 1 1 1 0 0 0 0
     MV 0 0 0 1 1 1 0 0 0 0 1 1 1 1 0 0 0 0 1 1 0
     cmp result  1 1 1 1 1 1 1 1 1 1 1 1 1 1 1 1  static "0" identifies positive match
                                        → exit condition from loop

FIG. 10c i=3  RV        1 1 1 1 1 1 1 1 0 0 0 0 0 0 0 0
     MV 0 0 0 1 1 1 1 1 1 1 1 0 0 0 0 0 0 0 1 1 1
     cmp result  0 0 0 0 0 0 0 0 0 0 0 0 0 0 0 0  static "0" identifies positive match
                                        → negative skew identified, i.e.
                                          skew = − insert = −3UI

FIG. 10d

METHOD FOR MEASURING AND COMPENSATING FOR SKEWS OF DATA TRANSMISSION LINES BY COMPENSATING FOR SKEW BY DELAY ELEMENTS SWITCHED IN RESPONSE TO THE CALCULATED REATIVE SKEW

RELATED APPLICATION

This application claims the benefit of U.S. Provisional Patent Application Ser. No. 60/457,810, filed Mar. 26, 2003, the disclosure of which is incorporated herein by reference in its entirety.

TECHNICAL FIELD

The invention refers to a method for measuring and compensating skews of data transmission lines each connecting a data transmission device with a data reception device. A digital delay time equalization is performed of parallel data links without a reference line.

BACKGROUND ART

Memory modules, referred to in the following text as DIMM (dual in-line memory modules) have a defined physical extent. Owing to the finite propagation speed of electrical signals, the physical extent of the DIMM thus corresponds to a delay time for the electrical signal for passing from a signal source to a signal sink. This phenomenon is generally referred to as the "line effect", which means that the "electrical length" of the interconnects can no longer be ignored. This is the situation when the highest frequency component which occurs in the signal is at a wavelength which is in the same order of magnitude as the physical extent between the signal source and the signal sink.

The higher the data rate on a DIMM, the higher are the frequencies of these frequency components and the shorter are the physical extents for which this line effect must be taken into account. Present-day memory developments are using data rates DR which, as a result of the described subject, are leading to major time-critical problems. These present memory module developments have the particular characteristic feature of a central integrated circuit (IC) or memory buffer which is mounted on each DIMM. This IC produces the electrical signals for communication with the memory modules locally, that is to say on the DIMM.

This basic design according to the state of the art is shown in FIG. 1. As can be seen, a range of different signals are indicated here, which are either of different length (DQ/DQS) or else are received simultaneously by a large number of memory modules (CA).

The HUB in the center of the dual in-line memory module (DIMM) is connected via bi-directional data transmission lines forming a data bus to the DRAM chips on the same memory module. Further the HUB or memory buffer is connected via a command and address bus (CA) to the DRAMs. The dual in-line memory module as shown in Figure in FIG. 1 can be connected to a motherboard comprising a microprocessor. The HUB or memory buffer in the center of the dual in-line memory module is connected via a data bus to the microprocessor and provides the microprocessor with data read from the DRAMs. Since distances of the DRAMs to the memory buffer are different data read from the DRAMs will reach the HUB or memory buffer in the center of the dual in-line memory module at different times due to the signal propagation time.

FIG. 2 shows a block diagram of a dual in-line memory module having a command and address bus and data buses connecting each DRAM to the central HUB.

FIG. 3 shows a general arrangement, according to the state of the art which comprises a central receiver (HUB) and X transmitting DRAM-modules. The overall data bus has a width of n bits, so that each transmitting DRAM-transmits a data bus component of n/N bits. By way of example, a 72 bit data bus of a DIMM comprising DRAMs can in each case be implemented with an 8 bit data bus component. The described line effects mean that data is subject to different delay times on different interconnects. At the time t1, all n transmitting DRAMs simultaneously send their data bus component to the receiver provided within said memory buffer (HUB). Owing to the different delay times, which are caused by the different distances between the transmitting DRAMs and the receiver within the HUB, the individual data bus components reach the receiver at different times (times t2, t3 and t4). However, for parallel data transmission it is necessary that all the information units (bits) which belong to one entire data word must reach the receiver within one transmission clock cycle. In a conventional arrangement this fact leads to a limitation to the maximum data transmission rate on the data bus, since the faster data signals originating from the DRAMs close to the HUB have always to wait for the slower signals of the more distant DRAMs before a new transmission cycle can be started.

FIG. 4 illustrates the problem that the integrity of the data signals transmitted on a parallel data bus is threatened by the different line delay times. As can be seen from FIG. 4, the receiver cannot accept the data until, at the earliest, the "data complete" time. This also shows that the maximum data rate DR max is influenced by this. The transmitter which is closest to the receiver (HUB) must not start to transmit the next data item until all the other (slower) data items have reached the receiver.

A conventional method according to the sate of the art for compensating for different delay times is for the interconnects to be routed in a meandering shape on the printed circuit board (PCB). However, this conventional compensating method is quite unsuitable for many applications because the meanders require additional space on the printed circuit board.

Another method according to the state of the art defines an additional reference channel with a defined data content between the transmitter an receiver. However, since there are a number of receiver modules on one DIMM, this additionally increases the complexity. These known prior art methods are therefore suitable only to a limited extent for determining and compensating for the delay time of data bits.

SUMMARY OF THE INVENTION

The method according to the present invention has the object to circumvent limitations to the data transmission rate and nevertheless to ensure the integrity of the transmitted data.

The method according to the present invention has the object to circumvent the limitation to the data transmission rate and nevertheless to ensure the integrity of the transmitted data.

This object is achieved by a method having the features of main claim 1.

The invention provides a method for measuring and compensating skews of data transmission lines connecting at least one data transmission device with a data reception device comprising for each data transmission line the following steps:

measuring the relative time delay of the data transmission line by transmitting a determined sequence of measurement vectors (MV) each consisting of an alternating bit pattern via said data transmission line, wherein the bit alternation frequency is halfed with every transmitted measurement vector (MV);

comparing the received measurement vectors (MV') transmitted via said data transmission line with corresponding reference vectors (RV) stored in said data reception device;

shifting the received measurement vectors (MV') by inserting data unit intervals (UI) until a received measurement vector (MV') matches a corresponding reference vector (RV);

calculating a relative skew of the data transmission line depending of the number of inserted data unit intervals (UI) with respect to a slowest data transmission line;

and compensating the calculated relative skew of the data transmission line by means of delay elements switched in response to the calculated relative skew.

In a preferred embodiment of the method for measuring and compensating skews of a data transmission lines comprises for each data transmission line the following step:

(a) initializing an iteration loop counter (i) and an insertion counting variable to zero (i:=0; insert:=0);

(b) activating the data transmission device to transmit a measurement vector ($MV_i$) consisting of an alternating bit pattern with a predetermined bit alternation frequency via said data transmission line to said data reception device, wherein each bit is transmitted during a predetermined data unit interval (UI), wherein the measurement vector ($MV_i$) corresponds to a reference vector ($RV_i$) stored in said data reception device;

c) comparing the measurement vector ($MV_i$) received by the data reception device via said data transmission line with the stored reference vector ($RV_i$);

d) wherein until the received measurement vector ($MV_i'$) and the stored reference vector ($RV_i$) do match the following sub-steps are performed in an iteration loop:

In a preferred embodiment of the method for measuring and compensating skews of data transmission lines the calculation of the relative skews of the data transmission line comprises the following steps:

(e1) incrementing the iteration loop counter (i) (i=i+1);

(e2) activating the data transmission device to transmit a next measurement vector having half the bit alternation frequency of the last measurement vector transmitted in the iteration loop of step (d) via said data transmission line to said data reception device;

(e3) substituting the last reference vector (RV) used in the iteration loop of step (d) by a reference vector which corresponds to the measurement vector transmitted in step (e2);

(e4) comparing the measurement vector (MV') received by the data reception device with the reference vector substituted in step e3);

(e5) wherein the skew of the data transmission line is calculated as: skew=$2^i$−insert in case that the vectors compared in step (e4) do not match and as: skew=−insert in case that the vectors compared in step (e4) do match, wherein insert is the insertion variable accumulated in step (d4).

In a preferred embodiment a method for measuring and compensating skews of a data transmission line is performed when the data reception device is powered up.

In a preferred embodiment after the compensation of the skew of all data transmission lines is accomplished data are transmitted from the data transmission device to the data reception device in a normal data transfer mode.

In a preferred embodiment the data transmission devices are DRAMs.

In a preferred embodiment the data reception device is a HUB of a memory module.

In a preferred embodiment the data reception device comprises for each data transmission line a clock and data recovery unit to lock to the first measurement vector transmitted via the data transmission line.

In a preferred embodiment of the method for measuring and compensating skews of a data transmission lines for compensating the skew of the data transmission line the following steps are performed:

determining the maximum skew (skew max) of the calculated skews of all data transmission lines;

calculating a relative skew of each data transmission line with respect to the maximum skew of the slowest data transmission line, and delaying each data transmission line with its calculated relative skew.

In a preferred embodiment of the method according to the present invention the data transmission device is activated by means of a request signal sent via a separate command line from the data reception device of the data transmission devices.

In a preferred embodiment the data transmission devices are activated simultaneously.

In a preferred embodiment of the method according to the present invention the data transmission line forms part of a bi-directional data bus.

In a preferred embodiment of the method according to the present invention the comparing of the received measurement vectors and the referenced vectors is performed by means of a EXOR logic.

BRIEF DESCRIPTION OF THE DRAWINGS

In the following preferred embodiments of the method for measuring and compensating skews of data transmission lines according to the present invention are described with reference to the enclosed figures.

FIG. 9 shows examples for illustrating the functionality of the method for measuring and compensating skews of data transmission lines according to the present invention;

FIG. 10 shows a second example for illustrating the functionality of the method for measuring and compensating skews of data transmission lines according to the present invention;

DETAILED DESCRIPTION OF THE INVENTION

Figure 1:
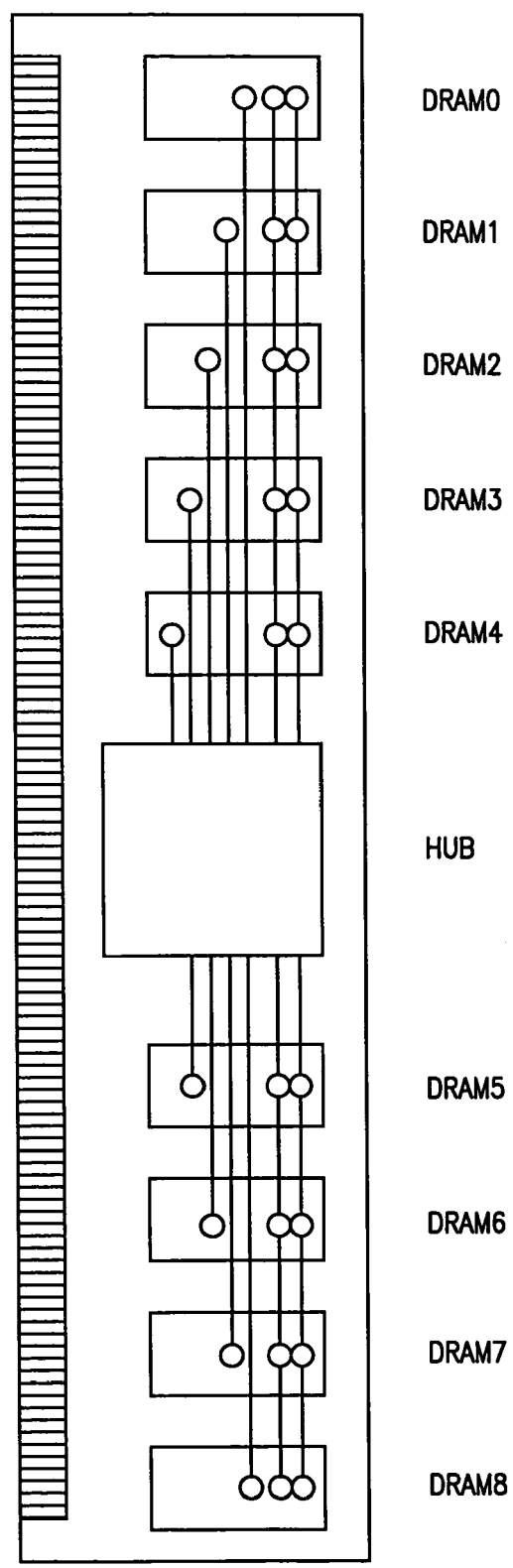
FIG. 1 shows a dual in-line memory module according to the state of the art.
Figure 2:
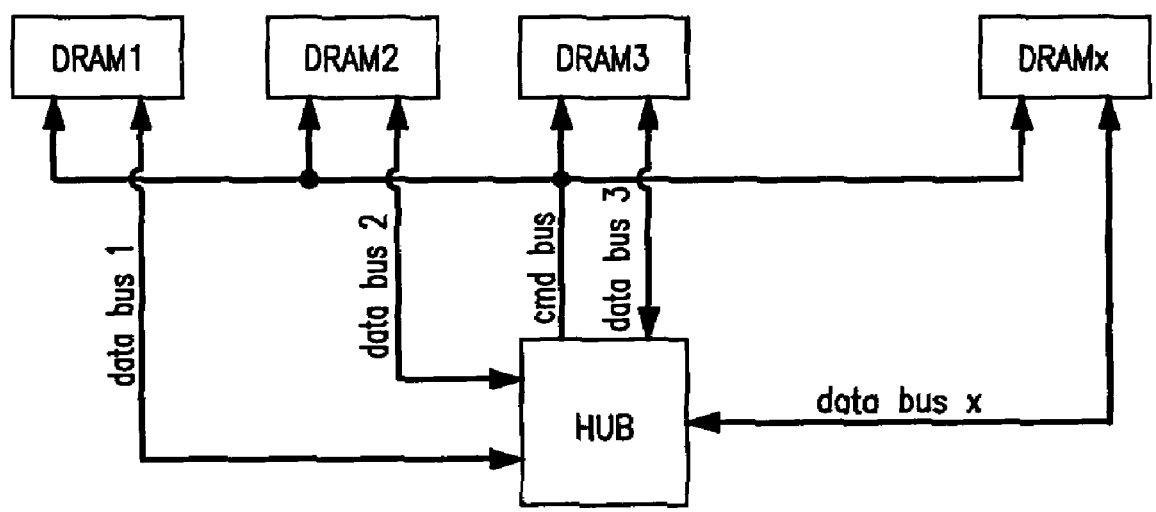
FIG. 2 shows a block diagram of a conventional dual in-line memory module according to the state of the art.
Figure 3:
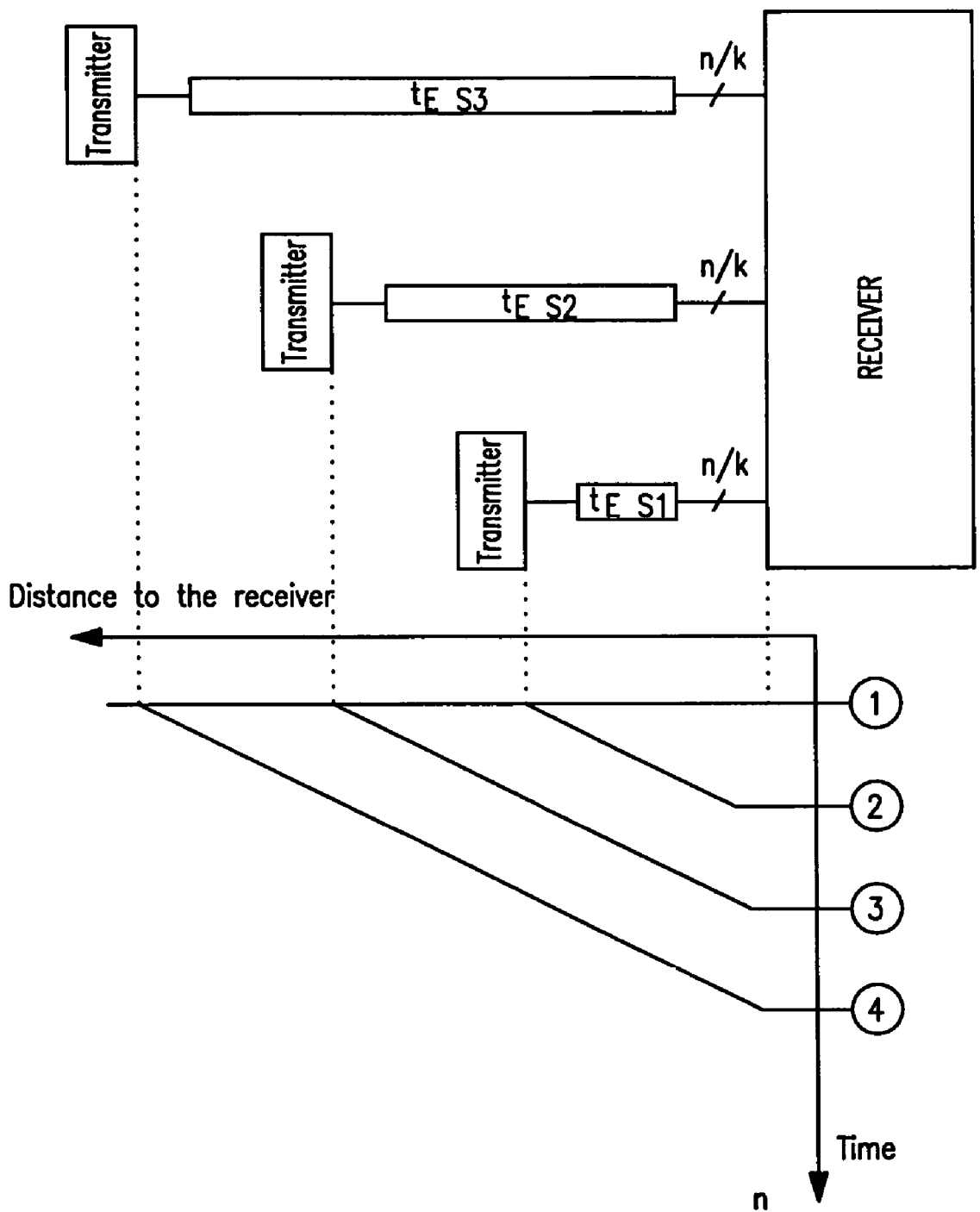
FIG. 3 shows a diagram for illustrating the problem underlying the present invention.
Figure 4:
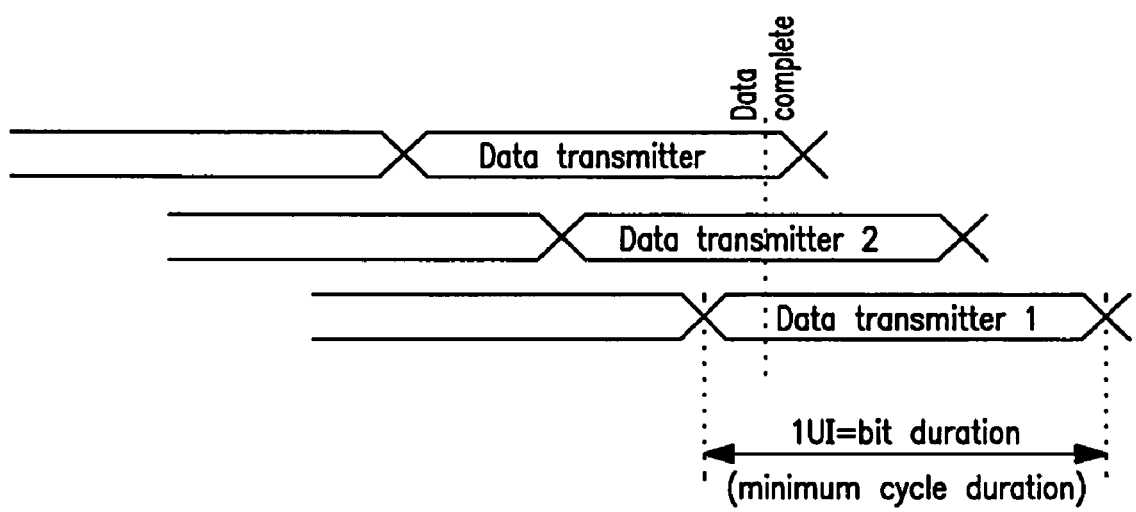
FIG. 4 shows a timing diagram for illustrating the problem underlying the present invention.
Figure 5:
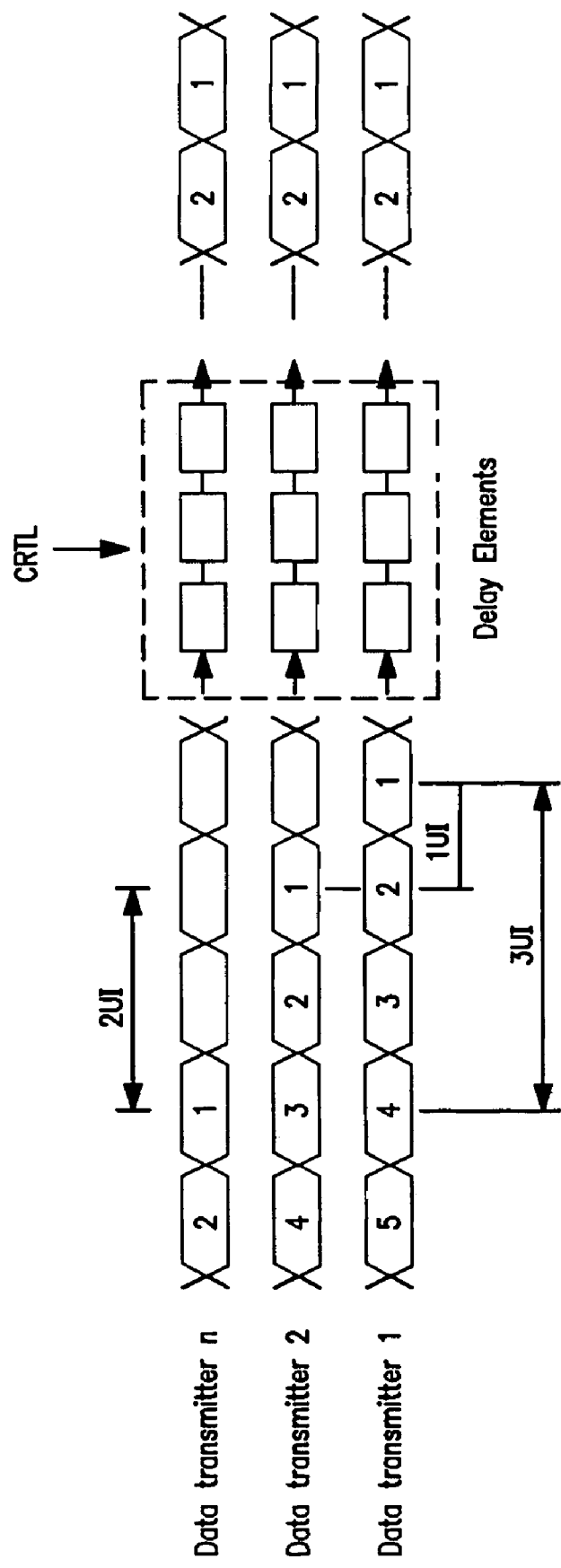
FIG. 5 shows a timing diagram to illustrate the result achieved by the method according to the present invention.

FIG. 5 illustrates, in principle, the result achieved by the method according to the present invention. The numbers indicated in the data bits show the association, that is to say all bits indicated with "1" form a part of a data word 1, all bits indicated with "2" form part of a data word 2 etc. As can be seen the data line n has a delay of 3 UI in comparison to the data line 1 and 2 UI in comparison to the data line 2. If the delay time of the individual signals is knwon, the faster signals can be artificially delayed in the receiver (de-skewing). This is done by an appropriate number (m) of delay elements, which delay each data signal by one clock pulse or clock period, and hence by one UI. After this inserted delay, the integrity of the data is ensured once again, with the advantage that the actual data transmission rate DR can be increased considerably.

The delay elements are provided for compensating the skew of n data transmission lines connecting m data transmission devices with the data reception device. For compensating the skew of the data transmission lines the relative skew of each data transmission line is calculated with respect to the slowest data transmission line. The example given in FIG. 5 shows a data transmission line n having a relative skew $S_{n2}$ of 2 UI with respect to data transmission line 2 and a relative skew $S_{n1}$ of 3 UI with respect to data transmission line 1. The method according to the present invention determines the maximum relative skew of all data transmission lines with respect to the slowest data transmission line which is in the given example of FIG. 5 is 3 UI.

The data transmission line 1 comprises a relative skew $S_{1n}$ to the slowest data transmission line n of 3 UI. Accordingly the first data transmission line 1 is delayed with a relative skew of 3 UI according to the method of the present invention. The data transmission line 2 having a relative skew $S_{2n}$ of 2 UI with respect to slowest data transmission line n is delayed with the calculated relative skew of 2 UI. The slowest data transmission line n is not delayed.

The compensation of the calculated relative skews of the data transmission lines is performed by means of delay elements switched in response to the calculated relative skews of the data transmission lines. Each data transmission line is connected to a chain of serial connected delay elements which are switched in response to a control signal according to the calculated skews of the data transmission lines.

As can be seen from FIG. 5 the data bit output by the delay elements comprises at any time only data bits which belong to the same data word. This skew compensated parallel data output signal is supplied by the memory buffer 2 to the microprocessor located on the motherboard.

Figure 6:
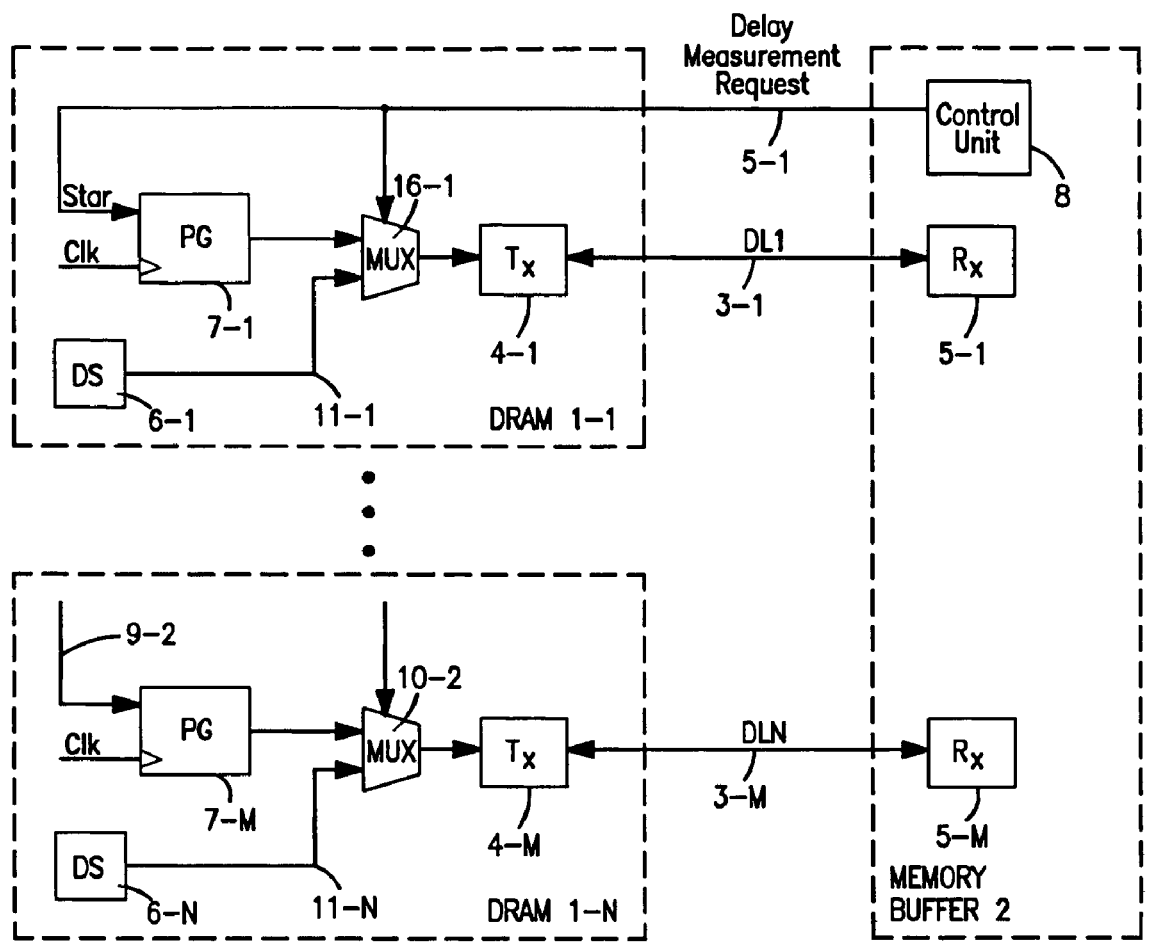
FIG. 6 shows a block diagram of a basic arrangement according to the present invention.

FIG. 6 shows an arrangement for the method for measuring and compensating skews of data transmission lines according to the present invention.

DRAMs 1-$i$ and a memory buffer or HUB 2 are connected via a data transmission line 3-$i$. For simplification of the illustration each DRAM chip 1-$i$ is connected to the memory buffer 2 via one data transmission 3-$i$. In a real arrangement each DRAM chip 1-$i$ is connected to the memory data 2 via parallel data lines which forms part of a bi-directional data bus. In a typical arrangement nine DRAM modules 1-$i$ are provided each connected to the memory buffer 2 via eight data transmission lines forming a bi-directional data bus having a data bus width of 72 bit. Each data transmission line 3-$i$ as shown in FIG. 6 connects a data transmission device 4-$i$ within a DRAM module 1-$i$ and a data reception device 5-$i$ within the memory buffer 2. For a bi-directional data bus having a data width of 72 bit 72 data reception devices 5-$i$ are provided within the HUB or memory buffer 2. Since the DRAM modules 1-$i$ have different distances to the memory buffer 2 the length of the data transmission lines 3-$i$ between the DRAM modules 1-$i$ and the memory buffer 2 vary so that skews or time delays on the respective data transmission lines occur which have to be compensated.

Each DRAM module 1-$i$ comprises a data source 6-$i$ of stored data to be read by the memory buffer 2 and a pattern generator 7-$i$ for generating the measurement vectors MV which are used for measuring the skew of the respective data transmission line 3-$i$. In the corresponding reception devices 5-$i$ corresponding reference data vectors RV are stored. In a preferred embodiment the measurement vectors MV originates from the memory area and are pre-loaded in advance to the measurement process.

The memory buffer 2 comprises a control unit 8 which is connected via a control line 9-$i$ to the measurement pattern generator 7-$i$ of each DRAM module 1-$i$. The control unit 8 sends a measurement request command simultaneously to all pattern generators 7-$i$ via a respective control line 9-$i$. Each DRAM module 1-$i$ further comprises multiplexing means 10-$i$. In the normal data transfer mode the data source 1-$i$ of each DRAM module 1-$i$ which is connected to a first input of the multiplexing means 10-$i$ via a data line 11-$i$ is switched by the multiplexing 10-$e$ through to the data transmission device 4-$i$.

Upon reception of the measurement request command from the control unit 8 the multiplexing means 10-$i$ is switched to the other input, i.e. the pattern generator 7-$i$ is activated by the control unit 8 and switched to the data transmission device 4-$i$. A predetermined sequence of measurement vectors MV is transmitted via the data transmission line 3-$i$ to the corresponding data reception device 5-$i$. In the data reception device 5-$i$ reference vectors (RV) corresponding to the transmitted measurement vectors (MV) are stored. The reference vectors RV have the same data bit pattern as the transmitted measurement vectors MV.

Figure 7:
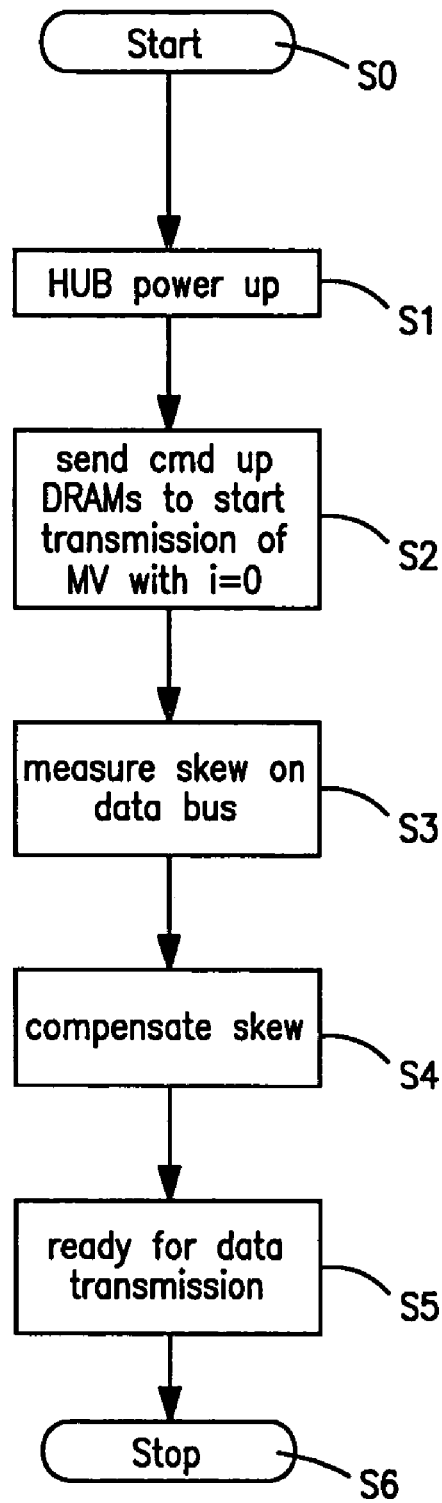
FIG. 7 shows a flow chart of a preferred embodiment of the method for measuring and compensating skews of data transmission lines according to the present invention.

FIG. 7 shows a flow chart of a preferred embodiment of the method for measuring and compensating skews of data transmission lines according to the present invention.

After starting in step SO the memory buffer HUB 2 is powered up in a step S1. The control unit 8 of the memory buffer 2 sends a request to all DRAMs 1-$i$ in a step 2 to start transmission of measurement vector MV.

In a step S3 the skews of all data transmission lines 3-$i$ of the bi-directional data transmission bus are measured.

After the measuring of the skews on the data transmission lines has been completed the skews are compensated in a step S4.

After compensation of the skews the DRAM modules are switched back in step 5 to a normal operation mode to transfer upon request data stored in the data source 6-$i$ via the data transmission lines 3-$i$ to the respective data reception devices 5-$i$.

The procedure ends in step S6.

Figure 8:
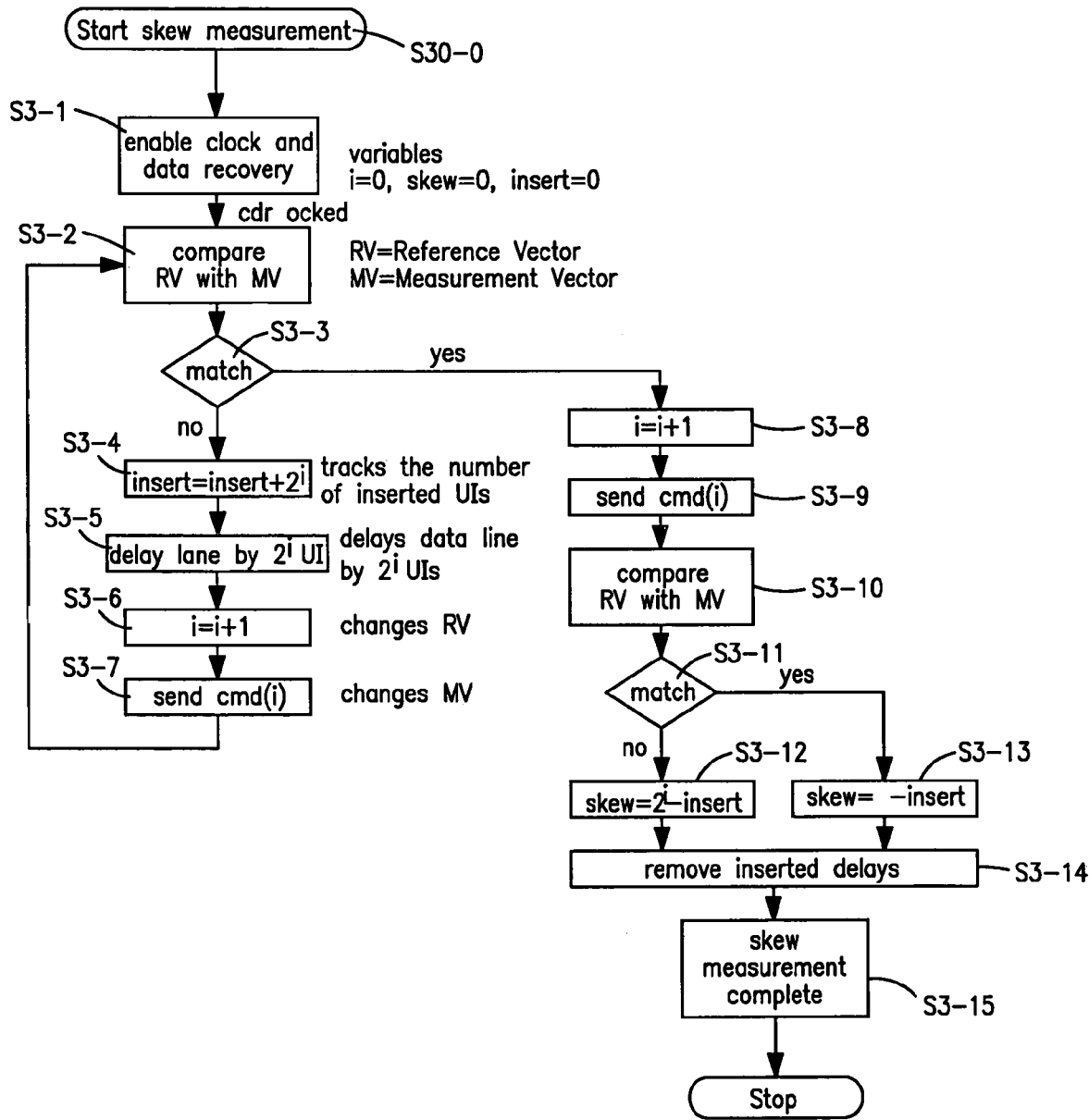
FIG. 8 shows a flow chart of a skew measurement procedure according to the present invention.

FIG. 8 shows a flow chart of the skew measurement procedure in step S3.

In step S3-0 is the skew measurement procedure is started.

In a first step S3-1 a clock in data recovery unit is enabled to lock to the data transmitted via the data transmission line 3-$i$. Further an iteration loop counter $i$ is initialized to zero. Further an insertion variable (insert) is reset to zero. The control unit 8 activates the data transmission device 4-$i$ to transmit a measurement vector MV consisting of an alternating bit data pattern with a predetermined bit alternation frequency via the data transmission line 3-$i$ to the data reception device 5-$i$. The first measurement vector $MV_\varnothing$ transmitted via the data transmission line 3-$i$ has the highest alternation frequency, i.e. the pattern generator 7-$i$ transmits a measurement vector $MV_0$ having a bit pattern where a high bit ("1") and low bit ("0") alternate each bit having a time length of a clock signal CLK.

$MV_\varnothing$="10101010 . . . "

The corresponding reference vector RV is stored within the data reception device 5-$i$.

In a step S3-3 a data comparison unit within the data reception device 5-$i$ compares the measurement vector MV received via the data transmission line 3-$i$ with the corresponding reference vector RV stored in a memory unit.

If it is decided in step S3-3 that the received measurement vector MV and the stored reference vector RV do not match an iteration loop is entered.

In a step S3-4 a number N of data unit intervals (UI) are inserted by shifting the received measurement vector MV by means of a shift register. The number of inserted data intervals (UI) are counted by accumulating an insertion variable (insert):

Insert=insert+N, wherein $N=2^i$.

In a step S3-6 the iteration loop counter i is incremented and the actual reference vector $RV_i$ to be compared is substituted by the next reference vector $RV_{i+1}$ having half the bit alternation frequency of the preceding reference vector RV;

In a step S3-7 the control unit 8 of the memory buffer 2 sends a request to the DRAMs 1-$i$ to activate the data transmission devices 7-$i$ to transmit the next measurement vector ($MV_{i+1}$) which has half the bit alternation frequency of the preceding measurement vector ($MV_i$). Then the procedure returns to the step S3-2. After the iteration loop has been run through several times the comparison in step S3-2 will finaly determine a match between the actual measurement vector MV and the actual reference vector RV. The procedure exits the loop in step S3-3 after a match has been indicated by the comparison means of the data reception device 5-$i$ to continue with the step S3-8. In step S3-8 the iteration loop counter i is incremented (i:=i+1).

In step S3-9 the control unit 8 of the memory buffer 2 activates the data transmission device 7-$i$ to transmit a next measurement vector ($MV_{i+1}$) having half the bit alternation frequency of the last measuring vector transmitted in the iteration loop in step S3-7. For the comparison an actual reference vector $RV_{i+1}$ substitutes the last reference vector $RV_i$ used in the iteration loop in step S3-2. The next measurement vector MV transmitted via the data transmission line 3-$i$ is compared with the substituted reference vector $RV_{i+1}$ to determine whether they do match.

In step S3-11 it is decided whether both vectors match. When both vectors do not match the skew of the respective data transmission line is calculated in step S3-12 as following: skew=$2^i$−insert, wherein insert is the insertion variable accumulated in step S3-4 of the iteration loop.

In contrast when it is decided in step S3-11 that the reference vector RV and the measurement vector MV compared in step S3-10 do match the skew of the respective data transmission line is calculated in step S3-13 as:

skew=−insert

Wherein insert is the insertion variable accumulated in step S3-4.

After the skew the of the data transmission line has been calculated in step S3-12, S3-13 the inserted data unit intervals (UI) are removed in step S3-14 and the skew measurement procedure is completed in step S3-15.

A skew measurement procedure as shown in FIG. 8 is explained by way of examples with respect to FIGS. 9, 10.

FIG. 9 shows the steps of a skew measurement procedure in a case where the data transmission line comprises a skew of three unit intervals (3 UI).

The first reference measurement vector $RV_\varnothing$ used for comparison with the corresponding received measurement vector $MV_\varnothing$ with the reference vector is the highest alternation frequency, i.e. a bit pattern "101010101 . . . ".

In step S3-1 the data transmission device 7-$i$ is activated to transmit a corresponding measurement vector $MV_0$ having a predetermined bit alternation frequency via the data transmission line 3-$i$ to be measured. The first measurement vector $MV_0$ transmitted to the data reception device 5-$i$ has the highest bit alternation frequency, i.e. the first measurement vector $MV_0$ has a bit pattern of "101010 . . . ".

Since in the given example of FIG. 9 the data transmission line 3-$i$ comprises a time delay or skew of +3 UI the data reception device 5-$i$ receives a data vector MV with a time delay of three bits. The first three bits of the received measurement vector MV which is stored in a shift register have the logic bit value "0" as can be seen in FIG. 9A. The stored reference vector $RV_0$ and the received measurement vector $MV_0$ are compared via an EXOR logic leading to a logic comparison result as shown in FIG. 9A. As can be seen the comparison result in the given example delivers a static "1" indicating that both vectors do not match. Consequently the iteration loop with steps S3-3, S3-4, S3-5, S3-6, S3-7 and S3-2 is run through and the iteration loop counter i is incremented as shown in FIG. 9B. The data transmission device 7-$i$ activated by the control unit 8 of memory buffer 2 transmits the next measurement vector $MV_1$ to the data reception device 5-$i$ via the data transmission line 3-$i$ having half the bit alternation frequency of the preceding measurement vector ($MV_0$). The reference vector $RV_0$ is substituted by a next reference vector $RV_1$ which corresponds to the next measurement vector. Accordingly the comparison in the data reception device 5-$i$ is performed with the next reference vector as shown in FIG. 9B having a bit pattern "11001100 . . . ". In step S3-5 $2^0=1$ data unit intervals (UI) are inserted into the measurement vector $MV_1$ by shifting the data content of the shift register in which the received measurement vector is stored one bit to the right as can be seen in FIG. 9B. The fourth "0" shown in the second line of FIG. 9B is inserted for the following comparison of $RV_1$ and $MV_1$.

After the shift has been completed the iteration loop counter i is incremented in step S3-6. The number of inserted data unit intervals UI is counted by accumulating the insertion variable (insert=$0+2^0=1$).

The received measurement vector $MV_1$ which has been shifted to the right is compared with the stored reference vector $RV_1$ as can be seen in FIG. 9B by an EXOR operation and a static zero at the output of the EXOR logic indicates a positive match between a measurement vector $MV_1$ and the reference vector $RV_1$. Because of the positive match the iteration loop is exit and in step S3-8 the iteration loop counter i is incremented to i=2.

In step S3-9 the control unit 8 activates the data transmission device and transmits the next measurement vector $MV_2$ having half the bit alternation frequency of the last measurement vector $MV_1$ transmitted in the iteration loop via the data transmission line 3-$i$ to the data reception device 5-$i$. Further the last reference vector $RV_1$ used in the iteration loop is substituted by a reference vector $RV_2$ which corresponds to the transmitted measurement vector $MV_2$.

As can be seen in FIG. 9C the next reference vector $RV_2$ comprises an alternating bit pattern with half the bit alternation frequency of the reference vector $RV_1$ as shown in FIG. 9B and corresponds to the transmitted measurement vector $MV_2$. In FIG. 9C the reference vector $RV_2$ has a bit pattern "1111000011110000 . . . " corresponding to the sent measurement vector $MV_2$ "1111000011110000 . . . " because of the time delay of the data transmission line 3-$i$ which is given in the example in FIG. 9 as 3 UI the measurement vector $MV_2$ buffered in the input of the data reception unit device 5-$i$ comprises 3 "0" at the beginning and the one inserted "0" from of the shift operation.

In step S3-10 the reference vector $RV_2$ and the received and shifted measurement vector $MV_2$ are compared with each other in an EXOR operation. The comparison result is shown in FIG. 9C. In the given example the static "1" at the output of the EXOR logic indicates that both vectors $RV_2$ $MV_2$ do not match so that the procedure continues after step S3-11 with step S3-12. The skew of data transmission line is calculated in step S3-12: skew=$2^2$−insert=4−1=+3 UI.

FIG. 10 shows a further example with a data transmission line having a negative skew of −3 UI with respect to a time reference. In the given example the first comparison is negative and the insert variable (insert) is accumulated to insert=0+$2^0$=1.

The next received measurement vector $MV_1$ shifted to the right by one bit ($2^0$) is compared to the corresponding reference vector $RV_1$. In the given example this comparison leads also to a negative match and the insertion variable (insert) is accumulated to insert=1+$2^1$=3. The iteration loop is run through because of the negative match. The received measurement vector MV is shifted by three bits to the right according to the insert variable as shown in FIG. 10C. The comparison performed in FIG. 10C leads to a positive match and the iteration loop is exit in step S3-3. The loop counter is incremented in step S3-8 and the transmitting device 7-$i$ is activated to transmit a last measurement vector $MV_3$ "1111111100000000" to be compared with the corresponding reference vector RV as shown in FIG. 10D. The static 0 at the output of the EXOR logic indicates a positive match in S3-11 so that the skew-insert is calculated in step S3-12, i.e. skew=−3 UI.

As can be seen from FIG. 9, 10 the comparison performed in step S3-10 decides the direction of the time delay. A positive match indicates a negative skew, i.e. the data transmitted via the data transmission line 3-$i$ are faster than reference data and the skew of the data transmission line is calculated in step S3-13 (skew=−insert).

Is the comparison result of step S3-10 negative ("no") the data transmission line 3-$i$ has a positive skew, i.e. the data transmitted on the data transmission line are slower than reference data. In this case the skew is calculated in step S3-12 (skew=$2^i$−insert).

After the skew measurement procedure in step S3 has been completed in step S3-15 the calculated skew of the data transmission lines are compensated in step S4.

Figure 11:
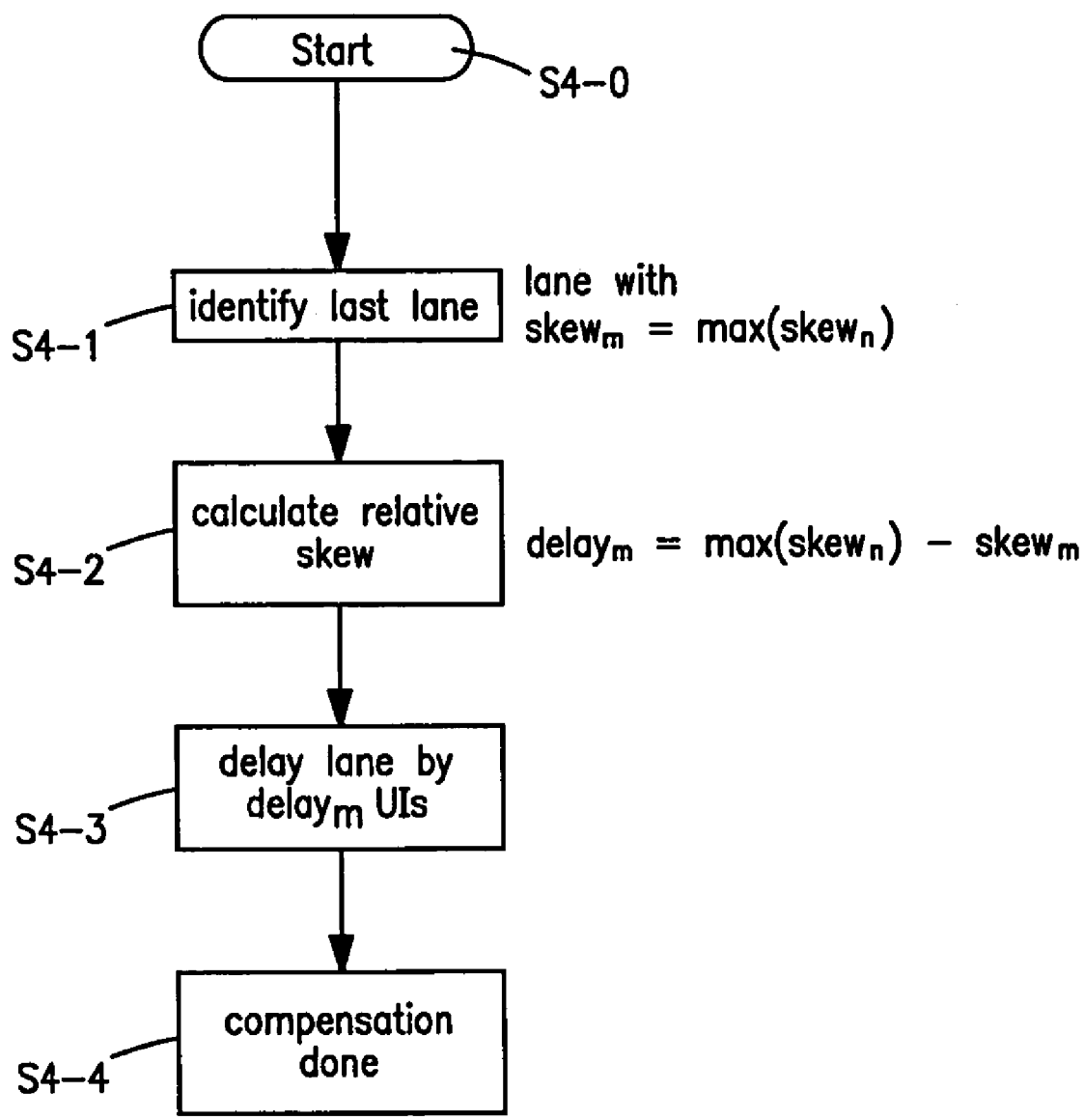
FIG. 11 shows a flow chart of a skew compensation procedure according to the present invention.

FIG. 11 shows a flow chart of the skew compensation procedure in step S4. After a start step S4-0 the slowest data transmission line is identified in step S4-1 as the data transmission line having the maximum skew of the calculated skews of all data transmission lines 3-$i$.

In a further step S4-2 the relative skew of each data transmission line with respect to the maximum skew of the slowest data transmission line is calculated.

After the relative skew of each data transmission line has been calculated each data transmission line 3-$i$ is delayed with its calculated relative skew in step S4-3. This is performed by switching corresponding data delay elements provided in the reception device of the data transmission line 3-$i$.

The skew compensation procedure is finished in step S4-4.

After compensation has been accomplished the control unit 8 of the memory buffer switches a multiplexer 10-$i$ within the DRAM 1-$i$ to the other input and the data of the data source 6-$i$ are transmitted to the data reception device 5-$i$ via the data transmission line 3-$i$ in a data transfer mode.

Once the voltage supply $V_s$ for the DIMM modules has been applied, that is to say once the system has been switched on, there is sufficient time to deal with an initialization routine. Since the described problem results from the physical configuration, that is to say the extent of the arrangement, the effect which must be compensated for by the method according to the invention is a static effect. Furthermore, all the signal sources 6-$i$ and signal sinks 5-$i$ are located in the same DIMM-module, so that there is no need to take account of any external influences.

The delay time measuring method according to the present invention determines a discrete value m for each data signal. This value m reflects the delay time measured against a fixed defined reference time. The following text deals by way of example with a preferred embodiment.

The measurement vector MV is defined such that it is possible for the receiving devices within the memory buffer to identify a maximum previously defined delay time m×UI, and to determine the corresponding number m of delay elements for compensation.

Is the maximum delay time $DT_{max}$=±2 UI (m=2), which must be identified and compensated for, the corresponding measurement vector MV is shown in table 1.

TABLE 1

| Measurement Vector | MV1 | MV2 | MV3 |
|---|---|---|---|
| Binary | 10101010 | 11001100 | 11110000 |
| Hexadecimal | AA | CC | F0 |

Alternatively, the inverted measurement reference vector $\overline{MV}$ can also be used as indicated in table 2.

TABLE 2

| Binary | 01010101 | 00110011 | 00001111 |
|---|---|---|---|
| Hexadecimal | 55 | 33 | 0F |

It is irrelevant to the principle of the invention which of these two measurement vectors MV, $\overline{MV}$ is used. However, the method according to the present invention is described only for the first case. Furthermore, these two measurement vectors MV, $\overline{MV}$ represent only the minimum required data length for detection and compensation for ±2 UI. In principle, the individual sub-sequences can just as well be extended.

The same measurement vector MV is stored in the receiving units as a reference measurement vector (RV) for all data lines Dli in the receiver module of the memory buffer 2.

The transmission devices start simultaneously to transmit this measurement vector MV. Depending on the delay time of the data line, the measurement vector MV is received at different time points. The upper line of table 3 in each case contains the reference measurement vector (RV) and the lower line of table 3 represents in each case the received data vector.

TABLE 3

| | MV | MV | MV |
|---|---|---|---|
| Case 1 | | | |
| No time delay | | | |
| Reference RV | 10101010 | 11001100 | 11110000 |
| Received MV | 10101010 | 11001100 | 11110000 |
| EXOR | 00000000 | 00000000 | 00000000 |
| Case 2 | | | |
| 1UI time delay | | | |
| Reference RV | 10101010 | 11001100 | 11110000 |
| Received MV | ?1010101 | 01100110 | 01111000 |
| EXOR | ?1111111 | 10101010 | 10001000 |
| Case 3 | | | |
| 2UI time delay | | | |
| Reference RV | 10101010 | 11001100 | 11110000 |
| Received MV | ??101010 | 10110011 | 00111100 |
| EXOR | ??000000 | 01111111 | 11001100 |
| Case 4 | | | |
| 1UI time delay | | | |
| Reference RV | 10101010 | 11001100 | 11110000 |
| Received MV | 01010101 | 10011001 | 1110000? |
| EXOR | 11111111 | 01010101 | 0001000? |
| Case 5 | | | |
| 2UI time delay | | | |
| Reference RV | 10101010 | 11001100 | 11110000 |
| Received MV | 10101011 | 00110011 | 110000?? |
| EXOR | 00000001 | 11111111 | 001100?? |

The evaluation of the received data vector is carried out in two steps. In a first step, it is identified whether there is any shift, that is to say a 0·U·1, 1 UI or 2 UI shift in comparison to the stored reference vector (RV). The direction is determined in a second step, that is to say whether the shift is a delay or an advance (see the examples above).

The presence of a shift is determined by means of an EXOR gate logic operation on the reference vectors and measurement vectors. Each shift depth is addressed by ist own measurement vector. The measurement vector 1 is used to identify a 1 UI shift, the measurement vector MV2 to identify a 2 UI shift, etc. As can be seen from the above examples, a permanent "1" is produced at the output of the EXOR logic only for the respective sequence. In this case, it is irrelevant whether this is a delay or an advance, the fact that a shift has occured is reliably determined using this method.

The measurement vector MV which follows the delay identification sequence is used to determine the sift direction. The measurement vector MV2 gives the associated direction for the example of a 1 UI delay. This is also the reason why three measurement vectors are necessary to reliably identify ±2 UI. Although the measurement vector MV2 itself reliably detects the presence of a shift of 2 UI, the measurement vector MV3 is, however, required in order to determine the associated direction.

The general case will now be defined in order to cover all the measurement vectors MV used for this purpose. It is assumed that a maximum shift of ±mUI is to be identified and compensated for. The measurement vector sequence can best be regarded as a data field comprising a number of measurement vectors MV. The measurement vectors MV are characterized in that the data alternation rate is halved from one vector to the next. For the situation mentioned above (±2 UI), the stored reference data field RDF of the reference vectors (RV) is therefore:

| | |
|---|---|
| 10101010 | RV1 |
| 11001100 | RV2 |
| 11110000 | RV3 |

RDF (m=2)

The reference data field RDF of the reference vectors therefore comprises 3 reference vectors, and each reference vector RV has a data length of 8 bits. The general data field for compensation for a maximum number of lines delay ±mUI has AZ lines, where AZ is defined as:

$$AZ = \text{ceil}\left(\frac{\log 2m}{\log 2}\right) + 1$$

"ceil" is a rounding function, which produces an integer value by rounding up. The length of the line vector (LV) is defined by: $L\text{-}LV = 2^{AZ}$ A minimum data field for compensation for ±4UI therefore comprises AZ=4 line vectors LV, each having $2^4 = 16$ bits. The associated reference data field (RDF) is then:

| | |
|---|---|
| 10101010 10101010 | RV1 |
| 11001100 11001100 | RV2 |
| 11110000 11110000 | RV3 |
| 11111111 00000000 | RV4 |

RDF (m=4)

Additional delay times within the DIMM-module, for example in data recovery or during multiplexing/demultiplexing, need no longer be dealt with separately, but are covered automatically by the method according to the present invention.

According to the present invention a special measurement vector sequence is transmitted by each DRAM. The data structure of the measurement vector has already been described in detail above. The fact that the data alternation rate of the measurement vector sequence is halved from one measurement vector to the next, is particularly important. The measurement vectors MVi thus produce a counting system, which can also identify additive delays, that is to say 3, 5 UI etc. Furthermore, all the transmission devices and the reception devices comprise the same measurement vector as reference vectors RV in order to make it possible to carry out the delay measurement with the delay measurement method according to the present invention.

What is claimed is:

1. Method for measuring and compensating skews of data transmission lines connecting at least one data transmission device with a data reception device via a parallel data bus comprising for each data transmission line the following steps:
   a) measuring a relative time delay of a data transmission line by transmitting a determined sequence of measurement vectors each consisting of an alternating bit pattern via said data transmission line, wherein a bit alternation frequency is halfed with every transmitted measurement vector;
   b) comparing received measurement vectors transmitted via said data transmission line with corresponding reference vectors stored in a data reception device;
   c) shifting the received measurement vectors by inserting data unit intervals until one of the received measurement vectors matches one of the corresponding reference vectors;
   d) calculating a relative skew of the data transmission line depending on the number of inserted data unit intervals with respect to a slowest data transmission line; and
   e) compensating the calculated relative skew of the data transmission line by means of delay elements switched in response to the calculated relative skew.

2. The method for measuring and compensating skews of a data transmission lines connecting at least one data transmission device and a data reception device according to claim 1 comprising for each data transmission line the following steps:
   a) initializing an iteration loop counter and an insertion counting variable to zero;
   b) activating the data transmission device to transmit a measurement vector consisting of an alternating bit pattern with a predetermined bit alternation frequency via said data transmission line to said data reception device, wherein each bit is transmitted during a predetermined data unit interval, wherein the measurement vector corresponds to a reference vector stored in said data reception device;
   c) comparing the measurement vector received by the data reception device via said data transmission line with the stored reference vector;
   d) wherein until the received measurement vector and the stored reference vector do match the following sub-steps are performed in an iteration loop:
      d1) activating the data transmission device to send a next measurement vector having half the bit alternation frequency of the preceding measurement vector,
      d2) substituting the reference vector to be compared by a next reference vector which corresponds to the next measurement vector,
      d3) inserting a number of data unit intervals by shifting the received measurement vector by means of a shift register, wherein the number of inserted data unit intervals is 2 given by the insertion counting variable;
      d4) incrementing the iteration loop counter; and
   e) calculating the relative skew of the data transmission line depending on the number of inserted data unit intervals counted by said insertion variable.

3. The method for measuring and compensating skews of a data transmission lines according to claim 2, wherein for calculating the relative skew of the data transmission line in step (e) the following sub-steps are performed, wherein the next measurement vector is a first next measurement vector:
   e1) incrementing the iteration loop counter;
   e2) activating the data transmission device to transmit a second next measurement vector having half the bit alternation frequency of a last measurement vector transmitted in the iteration loop of step (d) via said data transmission line to said data reception device;
   e3) substituting a last reference vector used in the iteration loop of step (d) by a reference vector which corresponds to the second next measurement vector transmitted in step (e2);
   e4) comparing the measurement vector received by the data reception device with the reference vector substituted in step e3);
   e5) wherein the skew of the data transmission line is calculated as: skew $=2^i$-insert
      in case that the vectors compared in step (e4) do not match and as:
      skew=-insert
      in case that the vectors compared in step (e4) do match, wherein insert is the insertion variable accumulated in step (d4).

4. The method for measuring and compensating skews of data transmission lines according to claim 1 wherein the method is performed when the data reception device is powered up.

5. The method according to claim 1 wherein after compensation the skew of all data transmission lines is accomplished data are transmitted from the data transmission devices to the data reception device in a normal data transfer mode.

6. The method according to claim 1 wherein the data transmission devices are DRAMs.

7. The method according to claim 1 wherein the data reception device is a HUB of a memory module.

8. The method according to claim 1 wherein the data reception device comprises for each data transmission line a clock and data recovery unit to lock to the first measurement vector transmitted via said data transmission line.

9. The method according to claim 1 wherein for compensating the skew of a data transmission line the following sub-steps are performed, wherein the relative skew is a first relative skew:
   a) determining a maximum skew of the calculated skews of all data transmission lines;
   b) calculating a second relative skew of each data transmission line with respect to the maximum skew of the slowest data transmission line,
   c) and delaying each data transmission line with its calculated relative skew.

10. The method according to claim 1 wherein the data transmission devices are activated by means of a request signal sent via a separate command line from the data reception device to the data transmission devices.

11. The method according to claim 10 wherein the data transmission devices are activated simultaneously.

12. The method according to claim 1 wherein the data transmission lines form part of a bi-directional data bus.

13. The method according to claim 1 wherein the comparing of the received measurement vectors and the reference vectors is performed by means of an EXOR logic.

* * * * *